(12) United States Patent
Chang et al.

(10) Patent No.: US 10,361,219 B2
(45) Date of Patent: Jul. 23, 2019

(54) IMPLEMENTING A HYBRID FINFET DEVICE AND NANOWIRE DEVICE UTILIZING SELECTIVE SGOI

(71) Applicant: International Business Machines Corporation, Armonk, NY (US)

(72) Inventors: Josephine B. Chang, Bedford Hills, NY (US); Leland Chang, New York, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 14/755,204

(22) Filed: Jun. 30, 2015

(65) Prior Publication Data

US 2017/0005112 A1    Jan. 5, 2017

(51) Int. Cl.
| | | |
|---|---|---|
| *H01L 21/02* | (2006.01) | |
| *H01L 21/84* | (2006.01) | |
| *H01L 27/12* | (2006.01) | |

(52) U.S. Cl.
CPC ...... *H01L 27/1211* (2013.01); *H01L 21/0262* (2013.01); *H01L 21/02164* (2013.01);
(Continued)

(58) Field of Classification Search
CPC .......... H01L 27/1211; H01L 21/02164; H01L 21/022365; H01L 21/02255;
(Continued)

(56) References Cited

U.S. PATENT DOCUMENTS

| 7,145,246 B2* | 12/2006 | Hareland | ............... B82Y 10/00 |
| | | | 257/773 |
| 7,374,986 B2* | 5/2008 | Kim | .................. H01L 29/42392 |
| | | | 257/210 |

(Continued)

FOREIGN PATENT DOCUMENTS

WO    2013041019 A1    3/2013

OTHER PUBLICATIONS

Bangsaruntip; "High Performance and Highly Uniform Gate-All-Around Silicon Nanowire MOSFETs with Wire Size Dependent Scaling"; pp. 1-4.

*Primary Examiner* — Mohsen Ahmadi
*Assistant Examiner* — Scott E Bauman
(74) *Attorney, Agent, or Firm* — Edward J. Wixted, III

(57) ABSTRACT

A silicon-on-insulator substrate which includes a semiconductor substrate, a buried oxide layer, and a semiconductor layer is provided. A hard mask layer is formed over a first region of the silicon-on-insulator substrate. A first silicon-germanium layer is epitaxially grown on the semiconductor layer within a second region of the silicon-on-insulator substrate. The second region is at least a portion of the semiconductor layer not covered by the hard mask layer. A thermal annealing process is performed, such that germanium atoms from the first silicon-germanium layer are migrated to the portion of the semiconductor layer to form a second silicon-germanium layer. The hard mask layer is removed. A layer of semiconductor material is epitaxially grown on top of the semiconductor layer and the second silicon-germanium layer, where the layer of semiconductor material composed of the same material as semiconductor layer.

5 Claims, 8 Drawing Sheets

(52) U.S. Cl.
CPC .. *H01L 21/02236* (2013.01); *H01L 21/02255* (2013.01); *H01L 21/02381* (2013.01); *H01L 21/02532* (2013.01); *H01L 21/02603* (2013.01); *H01L 21/845* (2013.01)

(58) Field of Classification Search
CPC ......... H01L 21/02381; H01L 21/02532; H01L 21/02603; H01L 21/0262; H01L 21/845; H01L 29/0676; H01L 29/161; H01L 21/02236
USPC ...................................................... 257/347
See application file for complete search history.

(56) References Cited

U.S. PATENT DOCUMENTS

| | | |
|---|---|---|
| 7,524,707 B2 | 4/2009 | Adetutu et al. |
| 7,763,915 B2 | 7/2010 | Joly et al. |
| 8,110,874 B2 | 2/2012 | Miyashita |
| 8,159,018 B2 * | 4/2012 | Akil .................. H01L 21/28282 257/324 |
| 8,232,153 B2 | 7/2012 | Chidambarrao et al. |
| 8,501,596 B2 | 8/2013 | Vincent et al. |
| 9,219,064 B2 * | 12/2015 | Kim ..................... H01L 27/092 |
| 9,379,182 B1 * | 6/2016 | Chen ................... H01L 29/0673 |
| 9,698,226 B1 * | 7/2017 | McArdle ............... H01L 29/161 |
| 2007/0246702 A1 | 10/2007 | Andrieu et al. |
| 2010/0109049 A1 * | 5/2010 | Cheng ............ H01L 21/823412 257/190 |
| 2011/0012090 A1 | 1/2011 | Singh et al. |
| 2011/0147881 A1 | 6/2011 | Fenouillet-Beranger et al. |
| 2016/0300857 A1 * | 10/2016 | Liu ..................... H01L 27/1211 |
| 2016/0351701 A1 * | 12/2016 | Cea ...................... H01L 29/785 |

\* cited by examiner

IMPLEMENTING A HYBRID FINFET DEVICE AND NANOWIRE DEVICE UTILIZING SELECTIVE SGOI

BACKGROUND

The present invention relates generally to suspended semiconductor device structures and in particular to disposing different device types on the same substrate.

Field effect transistors (FETs) can be semiconductor devices fabricated on a bulk semiconductor substrate or on a silicon-on-insulator (SOI) substrate. FET devices generally consist of a source, a drain, a gate, and a channel between the source and drain. The gate is separated from the channel by a thin insulating layer, typically of silicon oxide, called the gate oxide. A voltage drop generated by the gate across the oxide layer induces a conducting channel between the source and drain thereby controlling the current flow between the source and the drain. Current integrated circuit designs use complementary metal-oxide-semiconductor (CMOS) technology that use complementary and symmetrical pairs of p-type and n-type metal oxide semiconductor field effect transistors (MOSFETs) for logic functions.

The integrated circuit industry is continually reducing the size of the devices, increasing the number of circuits that can be produced on a given substrate or chip. It is also desirable to increase the performance of these circuits, increase the speed, and reduce the power consumption. A three-dimensional chip fabrication approach, such as a finFET, has been developed for semiconductor devices. A finFET is a non-planar FET, generally regarded as a type of suspended channel device. The "fin" is a narrow, vertical silicon base channel between the source and the drain. The fin is covered by the thin gate oxide and bordered on two or three sides by an overlying gate structure. The multiple surfaces of the gate allow for more effective suppression of "off-state" leakage current. The multiple surfaces of the gate also allow enhanced current in the "on" state, also known as drive current. These advantages translate to lower power consumption and enhanced device performance.

In the area of suspended channel device structures, the suspension step is a pivotal point in the process sequence. In several integration flows, the use of an SOI wafer is often proposed, however, this adds to the overall technology cost, so the use of a bulk silicon wafer is often preferred. Several flows for bulk wafers have been considered, but these process flows may often rely on oxidizing a region under the fin or nanowire after the channel is protected by a hard mask and spacer, resulting in volumetric expansion of the oxide underneath the channel.

SUMMARY

Embodiments of the present invention disclose a method of forming a silicon-on-insulator substrate and the resulting substrate. A silicon-on-insulator substrate which includes a semiconductor substrate, a buried oxide layer, and a semiconductor layer is provided. A hard mask layer is formed over a first region of the silicon-on-insulator substrate. A first silicon-germanium layer is epitaxially grown on the semiconductor layer within a second region of the silicon-on-insulator substrate. The second region is at least a portion of the semiconductor layer not covered by the hard mask layer. A thermal annealing process is performed, such that germanium atoms from the first silicon-germanium layer are migrated to the portion of the semiconductor layer to form a second silicon-germanium layer. The hard mask layer is removed. A layer of semiconductor material is epitaxially grown on top of the semiconductor layer and the second silicon-germanium layer, where the layer of semiconductor material composed of the same material as semiconductor layer.

DETAILED DESCRIPTION

Embodiments in accordance with the present invention contemplate the difficulty in tuning device strength in finFET-implemented circuitry. Adjusting device width, as one might attempt in planar CMOS (complementary metal-oxide-semiconductor transistors), is not an option in non-planar implementations, and attempting to weaken a FET (field-effect transistor) with dopants is undesirable due to the random dopant fluctuation (RDF) associated with some fabrication processes.

Fabrication of large-scale integration devices that include multiple functions can present particular problems. Processors that include a CPU (central processing unit) and a GPU (graphics processing unit) are in demand for inclusion in laptop computers, notebooks, and tablets. A CPU generally requires high-performance FETs, whereas, for GPU design, power consumption may be a more important concern. Consequently, FETs with lower drive current, perhaps implemented using devices with a lower overall device width, would be well-suited for such an application.

Embodiments in accordance with the present invention contemplate forming more than one region on a silicon on insulator (SOI) wafer. One region may remain silicon, thus lending itself to fabrication of finFET devices for the CPU portion of a device. In another region silicon-germanium (SiGe) on insulator (SGOI) may be formed, with a silicon epitaxial layer (silicon epi) grown on top of it. The lower SiGe layer may be employed as a release layer, thus enabling fabrication of nanowire FETs having a lower effective channel width (Weft) for the GPU portion.

An illustrative embodiment in accordance with the present invention is directed toward formation of a finFET device in an appropriate region of a wafer. Forming a buried gate structure wherein the gate is beneath the fin of a finFET device can allow for reduced height of the gate above the fin, thereby reducing the proximity of the gate to the source/drain contacts. The reduced surface area of the gate in proximity to the source/drain contacts can reduce the parasitic capacitance of the finFET device. Detailed descriptions of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Figure 1:
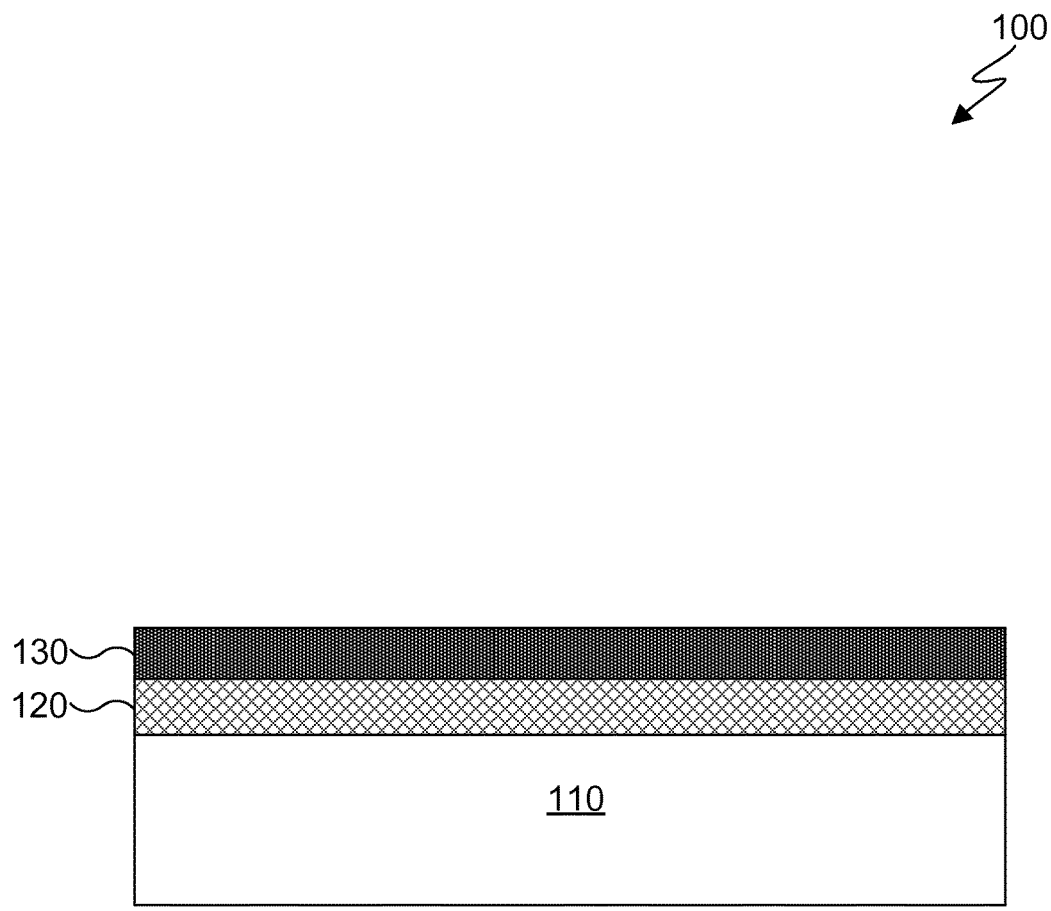
FIG. 1 depicts a cross-sectional view of a semiconductor substrate which includes a semiconductor substrate, a buried oxide layer, and a semiconductor layer upon which a finFET structure may be fabricated, in accordance with an embodiment of the invention.

Example embodiments in accordance with the present invention will now be described in detail with reference to the figures. FIG. 1 depicts a cross-sectional view of a semiconductor wafer, generally designated 100, upon which both finFET and nanowire FET structures may be fabricated, in accordance with an embodiment of the invention. In the depicted embodiment, semiconductor wafer 100 includes semiconductor substrate 110, buried oxide layer 120, and semiconductor layer 130. Semiconductor substrate 110 is a semiconductor material, preferably a silicon-containing material including, but not limited to, silicon, silicon germanium alloys, silicon carbon alloys, or silicon germanium carbon alloys. In an embodiment, the finFET structure is built on a silicon-on-insulator (SOI) wafer which includes a buried oxide layer (BOX) such as buried oxide layer 120 and a semiconductor layer 130 formed on buried oxide layer 120. In various embodiments, buried oxide layer 120 can be silicon oxide ($SiO_2$) that acts to insulate semiconductor layer 104 from semiconductor substrate 110, with a typical thickness of about 10 nm to about 500 nm, and preferably about 150 nm. Buried oxide layer 120 can be formed by thermally oxidizing the exposed surface of semiconductor substrate 110, or may be deposited onto semiconductor substrate 110 using, for example, chemical vapor deposition (CVD) or atomic layer deposition (ALD). Semiconductor layer 130 can then be bonded to buried oxide layer 120. In a preferred embodiment, semiconductor layer 130 is silicon (Si) with a typical thickness of about 5 nm to about 40 nm and preferably about 20 nm. In various embodiments, semiconductor layer 130 can be composed of any semiconductor material, for example, silicon-containing materials including, but not limited to, silicon germanium alloys, silicon carbon alloys, silicon germanium carbon alloys, or III-V semiconductor materials.

It should be appreciated that embodiments of the invention are not limited to the embodiment depicted in FIG. 1 where semiconductor wafer 100 is an SOI wafer. In other embodiments, semiconductor wafer 100 can be a bulk silicon wafer, and in such embodiments, no buried oxide layer, such as buried oxide layer 120, will be present within semiconductor wafer 100.

Any known method of fabricating a semiconductor wafer such as semiconductor wafer 100 can be used in various embodiments of the invention. Additionally, semiconductor wafer 100 may be purchased from a vendor prior to performing the fabrication steps depicted in FIGS. 2-8.

Figure 2:
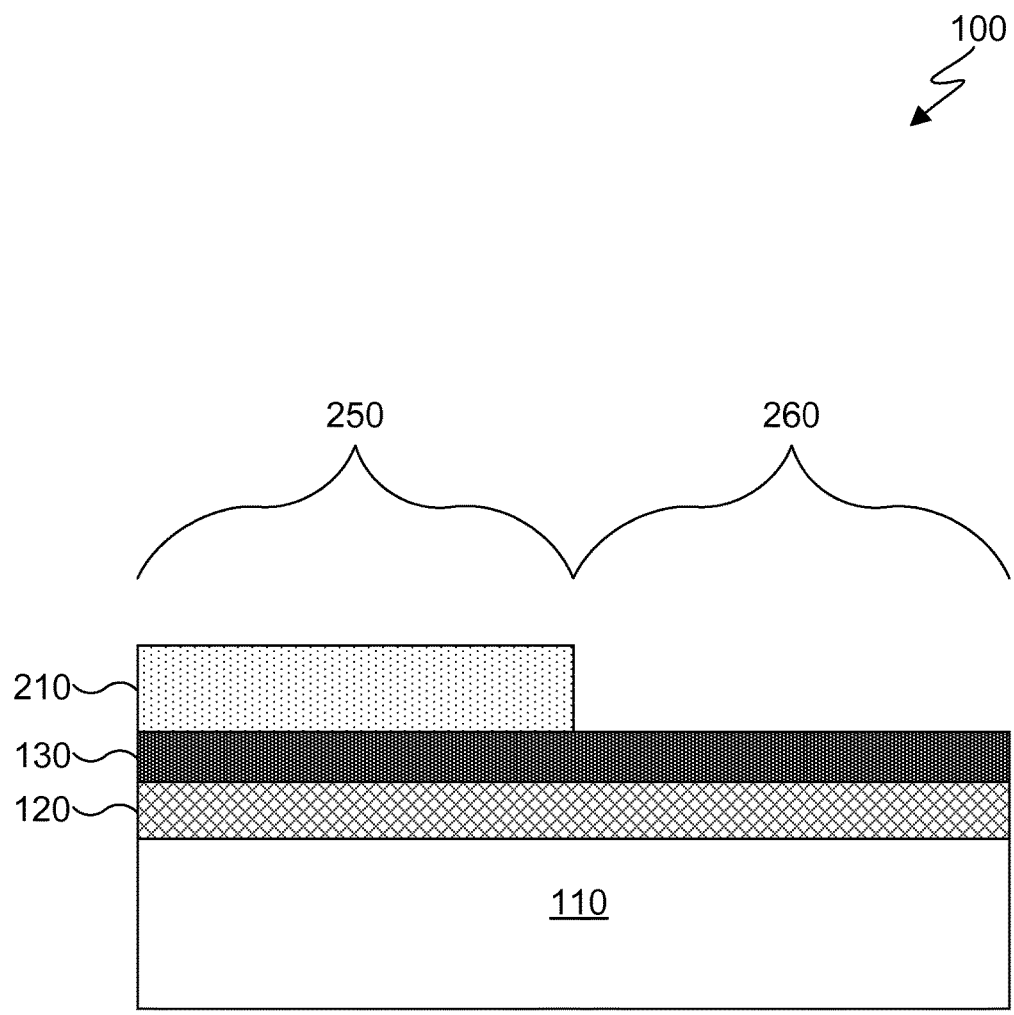
FIG. 2 depicts a cross-sectional view of the semiconductor wafer after the formation of a hard mask layer in a first region of the semiconductor wafer, in accordance with an embodiment of the invention.

FIG. 2 depicts a cross-sectional view of semiconductor wafer 100 after the deposition and patterning of hard mask layer 210, in accordance with an embodiment of the invention. In the depicted embodiment, hard mask layer 210 is deposited on at least a portion of the exposed top surface of semiconductor layer 130. In various embodiments, hard mask layer 210 is composed of, for example, a dielectric material such as silicon nitride, silicon oxide, or a combination of silicon nitride and silicon oxide deposited using, for example, a process such as low pressure chemical vapor deposition (LPCVD). In various embodiments, standard photolithographic processes are used to define the pattern of hard mask layer 210 in a layer of photoresist (not shown) deposited on hard mask layer 210. The desired hard mask layer pattern may then be formed in hard mask layer 210 by removing hard mask layer 210 from the areas not protected by the pattern in the photoresist layer. Hard mask layer 210 is removed using, for example, an etch process such as reactive ion etching (RIE). RIE uses chemically reactive plasma, generated by an electromagnetic field, to remove various materials. A person of ordinary skill in the art will recognize that the type of plasma used will depend on the material of which hard mask layer 210 is composed, or that other etch processes such as wet chemical etching or laser ablation may be used.

Figure 3:
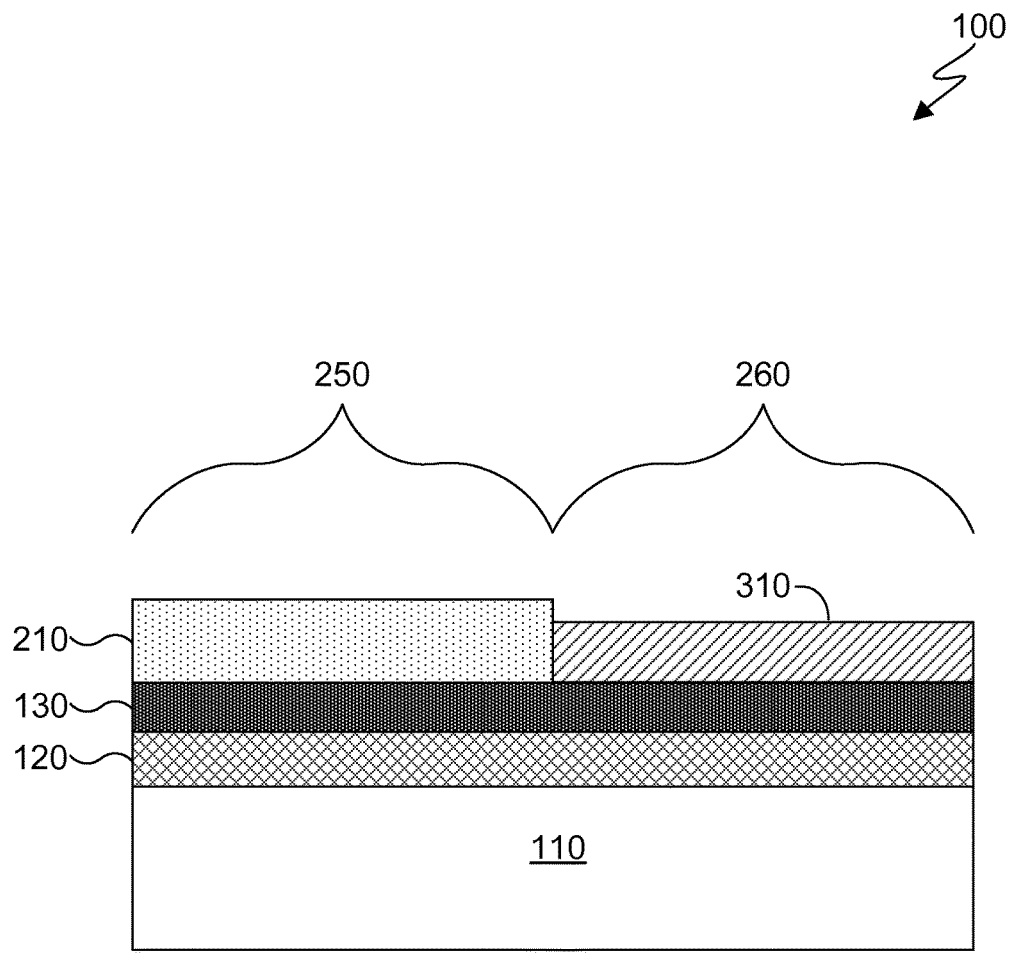
FIG. 3 illustrates a cross-sectional view of the semiconductor wafer after selectively growing a Silicon-Germanium (SiGe) layer on the exposed portions of the semiconductor layer within a second region of the semiconductor wafer, in accordance with an embodiment of the invention.

In general, hard mask layer 210 can be any hard mask material that can act as an etch mask during the patterning of semiconductor layer 130, as described in greater detail with respect to FIG. 3. Additional planarization steps such as chemical-mechanical planarization (CMP) may be utilized after the deposition of hard mask layer 210 to ensure that the top surface of hard mask layer 210 is relatively flat.

In general, hard mask layer 210 is removed from the region of semiconductor wafer 100 generally designated as region 260, which is intended to be utilized as an active region for the formation of nanowire FET devices. Similarly, hard mask layer 210 is not removed from the region of semiconductor wafer 100 generally designated as region 250, which is intended to be utilized as an active region for the formation of finFET devices. In various embodiments of the invention, multiple regions such as region 260 where hard mask layer 210 is removed may be present. The embodiment depicted in FIG. 2, where half of semiconductor wafer 100 is included in region 260, is meant to be illustrative and is not intended to be limiting.

FIG. 3 illustrates a cross-sectional view of semiconductor wafer 100 after selectively growing Silicon-Germanium (SiGe) layer 310 on the exposed portions of semiconductor layer 130, in accordance with an embodiment of the invention.

In one embodiment, SiGe layer 310 is composed of a silicon-germanium alloy which includes 30% germanium and 70% Silicon. In another embodiment, SiGe layer 310 is composed of pure germanium. In a preferred embodiment, SiGe layer 310 includes between 25% and 35% germanium. In general, SiGe layer 310 can be any silicon-germanium alloy which includes at least 15% germanium. SiGe layer 310 can be formed using a process such as chemical vapor deposition (CVD). In other embodiments, any other known process for selectively growing a layer of semiconductor material can be used. In one embodiment, SiGe layer 310 is formed to a height of 20 nm, and in other embodiments SiGe layer 310 is formed to a height between 5 nm and 50 nm.

The presence of a dielectric material such as hard mask layer 210 prevents SiGe layer 310 from being formed within region 250. In the depicted embodiment, SiGe layer 310 is formed selectively only on the exposed portion of semiconductor layer 130 present within region 260.

In various embodiments, additional planarization or CMP steps are utilized to even the top of SiGe layer 310 with the top of hard mask layer 210 and to ensure that the top surface of SiGe layer 310 is relatively flat.

Figure 4:
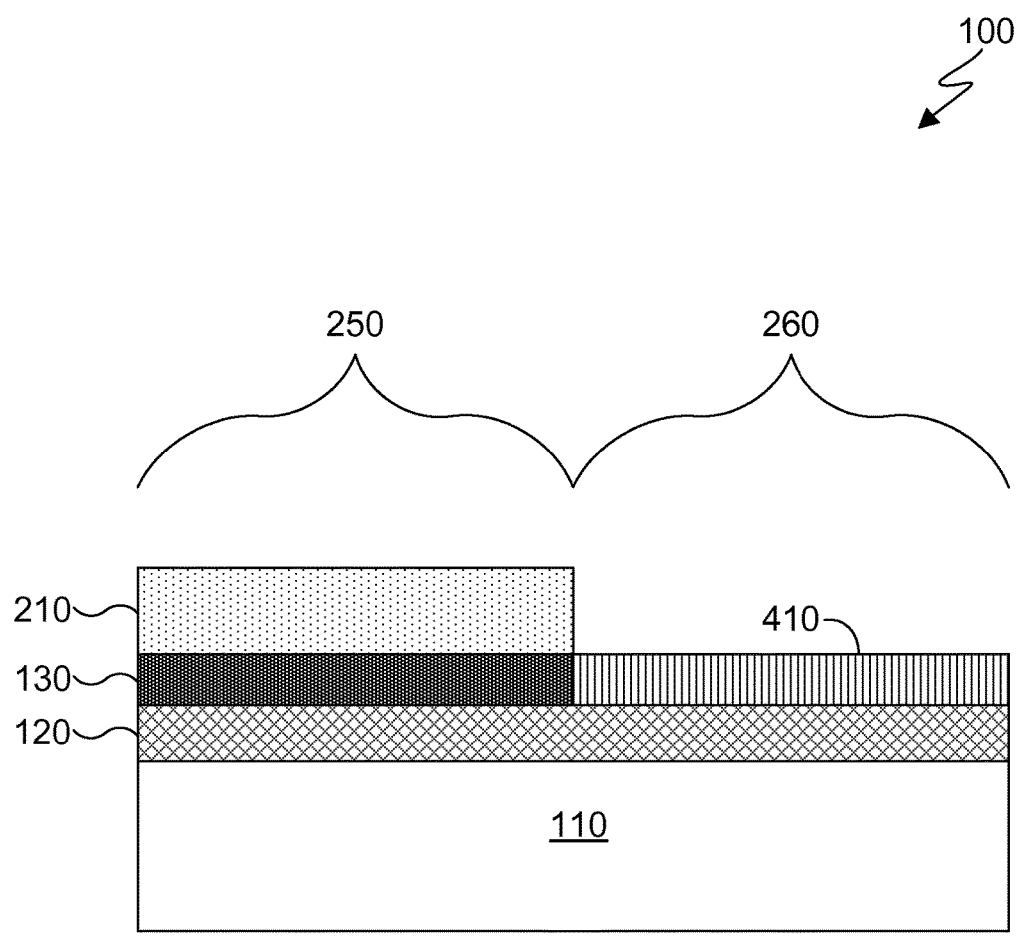
FIG. 4 illustrates a cross-sectional view of the semiconductor wafer after the use of a germanium condensation or thermal mix process to form a silicon-germanium layer within the second region, in accordance with an embodiment of the invention.

FIG. 4 illustrates a cross-section view of semiconductor wafer 100 after the use of a germanium condensation process to form silicon-germanium layer 410 within the portion of semiconductor layer 130 included within region 260, in accordance with an embodiment of the invention. In various embodiments of the invention, either a germanium condensation or a thermal mix process can be used to form SiGe layer 410.

A germanium condensation process is a high-temperature thermal anneal which is performed in an oxidizing environment. In a preferred embodiment, the thermal anneal is performed at a temperature between 1000 degrees Celsius and 1200 degrees Celsius. In one embodiment, the oxidizing environment in which the thermal anneal is performed is composed of an oxidizing agent such as oxygen, nitrous oxide, or water vapor which may be diluted in an inert ambient such as nitrogen or argon. The purpose of the germanium condensation process is to enrich the germanium content of the portion of semiconductor layer 130 present within region 260 through the migration of germanium atoms from SiGe layer 310 into semiconductor layer 130, thus forming SiGe layer 410. As a result of the presence of an oxidizing environment, an oxide layer such as silicon oxide ($SiO_2$) forms on the exposed portions of SiGe layer 410. In general, because germanium is not incorporated into the oxide layer, the germanium is driven into the underlying silicon or silicon-germanium layer to enrich the germanium content of the underlying layer. In embodiments where a germanium condensation process is utilized, the silicon oxide which forms as a result of the germanium condensation process is selectively removed using a process such as a hydrogen fluoride (HF) dip.

A thermal mix process is a high-temperature thermal anneal which is performed in an inert environment, such as a noble gas or nitrogen. Similarly to a germanium condensation process, the high temperature thermal anneal results in the migration of germanium atoms from SiGe layer 310 into the portion of semiconductor layer 130 present within region 260, thus forming SiGe layer 410. Due to the lack of an oxidizing environment in a thermal mix process, no silicon oxide is formed on the exposed portions of SiGe layer 410.

In a preferred embodiment, after the germanium condensation or thermal mix processing, SiGe layer 410 is composed of roughly 30% Germanium and 70% Silicon. Based on the thicknesses of semiconductor layer 130, the thickness of SiGe layer 310, and the length and temperature of the germanium condensation or thermal mix process used in various embodiments of the invention, the percentage of germanium within SiGe layer 310 is selected to achieve the desired percentage of germanium present within SiGe layer 410.

Figure 5:
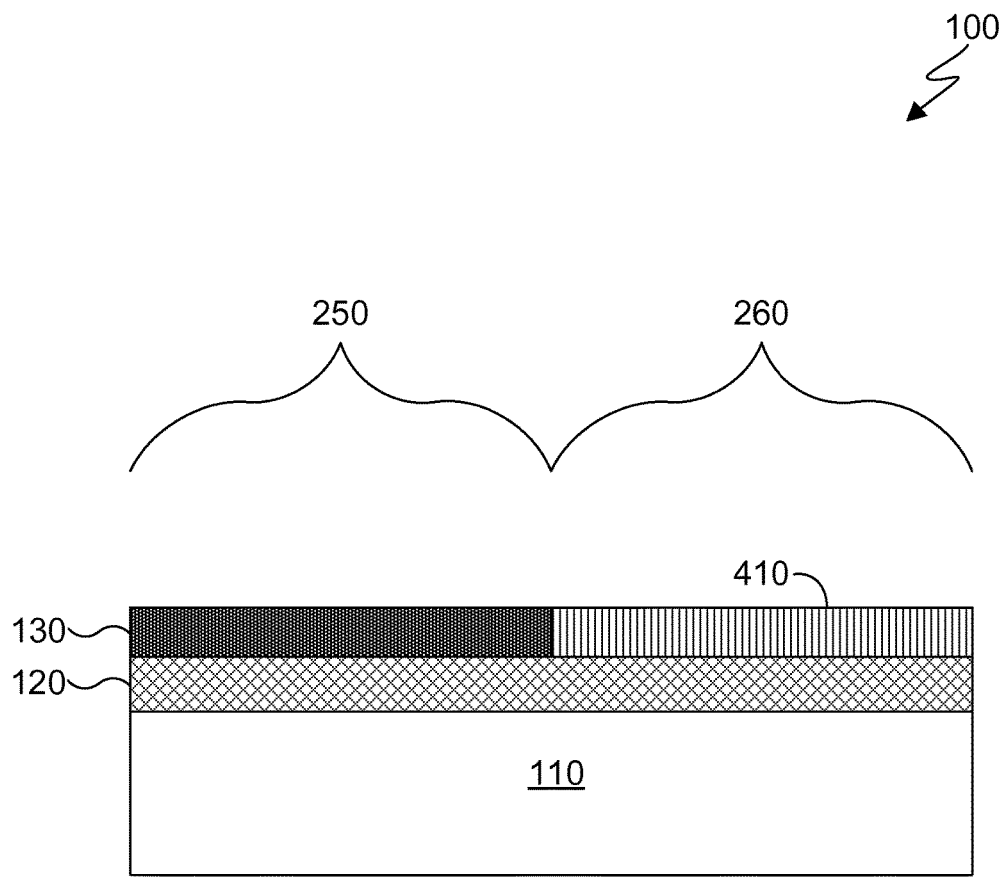
FIG. 5 illustrates a cross-sectional view of the semiconductor wafer after the removal of the hard mask layer, in accordance with an embodiment of the invention.

FIG. 5 illustrates a cross-sectional view of semiconductor wafer 100 after the removal of hard mask layer 210, in accordance with an embodiment of the invention. In one embodiment, planarization or CMP steps are utilized to remove hard mask layer 210. In another embodiment, a selective etch process such as a hydrofluoric acid (HF) dip is used to remove hard mask layer 210 without removing any portion of any other layers within semiconductor wafer 100. In various embodiments, other etch processes can be utilized to remove hard mask layer 210. It will be appreciated that the etch process used to remove hard mask layer 210 in a given embodiment is selected based on the composition of hard mask layer 210 in that embodiment.

Figure 6:
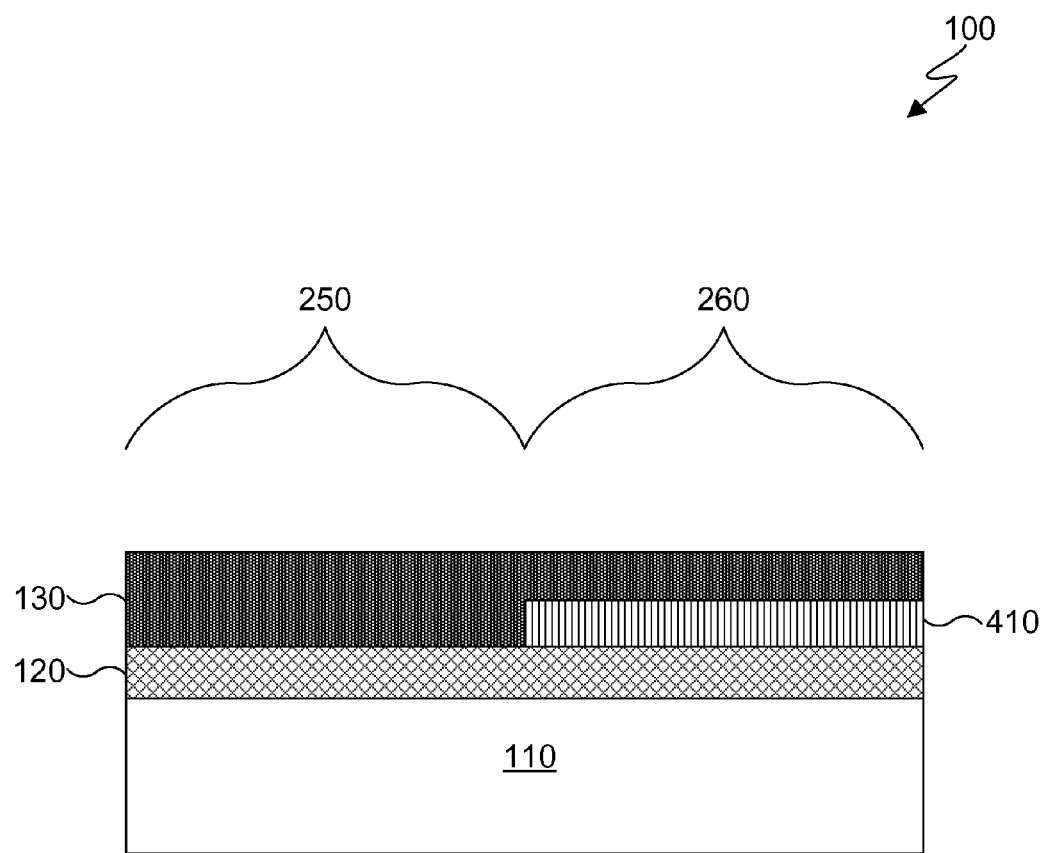
FIG. 6 illustrates a cross-sectional view of the semiconductor wafer after the epitaxial growth of additional semiconductor material on the semiconductor layer and the SiGe layer, in accordance with an embodiment of the invention.

FIG. 6 illustrates a cross-sectional view of semiconductor wafer 100 after the epitaxial growth of additional semiconductor material on semiconductor layer 130 and SiGe layer 410, in accordance with an embodiment of the invention. In the embodiment depicted in FIG. 6, the additional semiconductor material formed is composed of silicon and has a thickness of 30 nm. In other embodiments, the thickness of the additional semiconductor material is between 5 nm and 50 nm.

In general, the additional semiconductor material which is formed has the same composition as the material of which semiconductor layer 130 is formed. Additionally, in preferred embodiments, the material of which the additional semiconductor material is formed has etch selectivity to the material of which SiGe layer 410 is formed.

Once semiconductor wafer 100 reaches the form depicted in FIG. 6, fin patterning and formation may proceed in both regions 250 and 260. Once fins have been formed in both regions 250 and 260, a wire release process, or an etch process which selectively removes SiGe layer 410, may be performed over both regions 250 and 260, however the process will not release the fins in Region 250, because the release layer (SiGe layer 410) is only present within Region 260.

Figure 7:
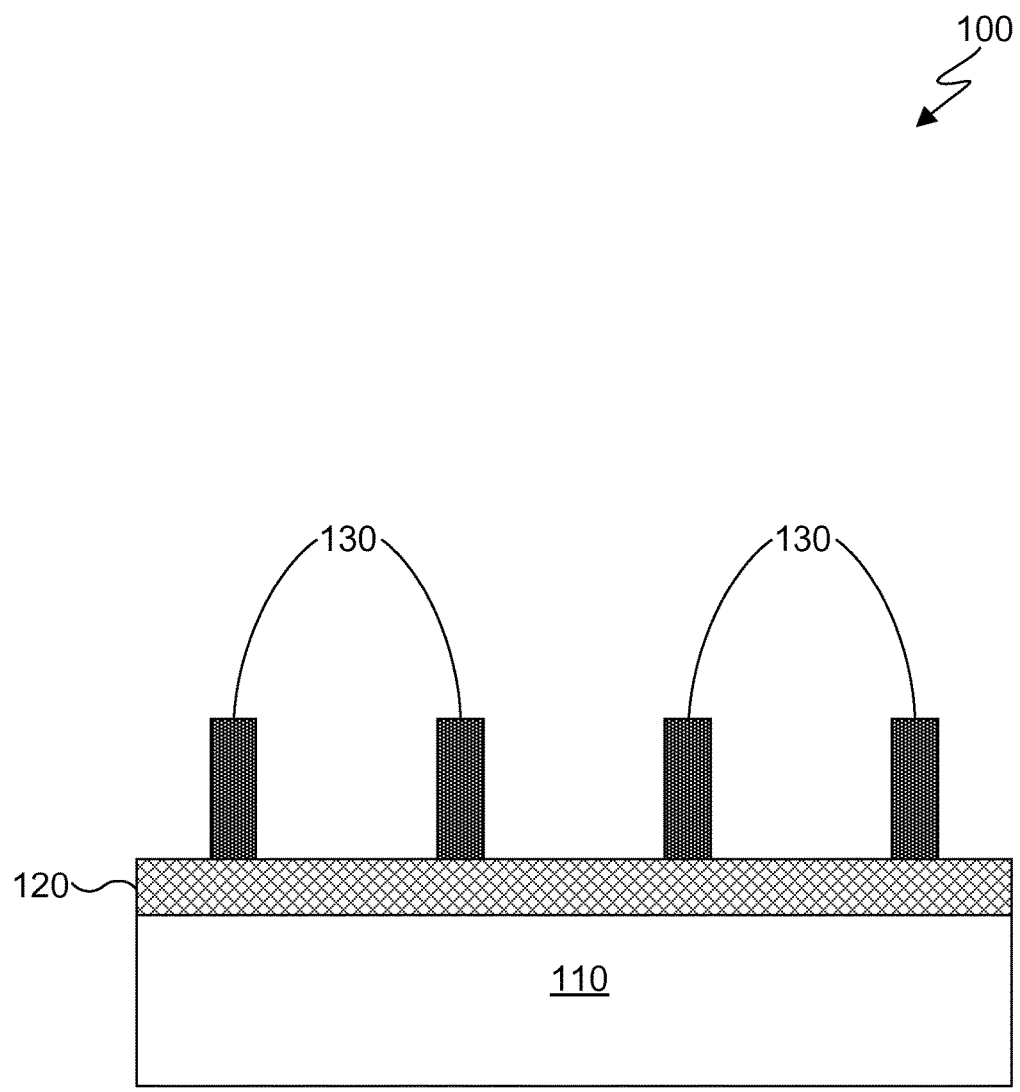
FIG. 7 illustrates a cross-sectional view of a group of fins formed within the first region of the semiconductor wafer, in accordance with an embodiment of the invention.
Figure 8:
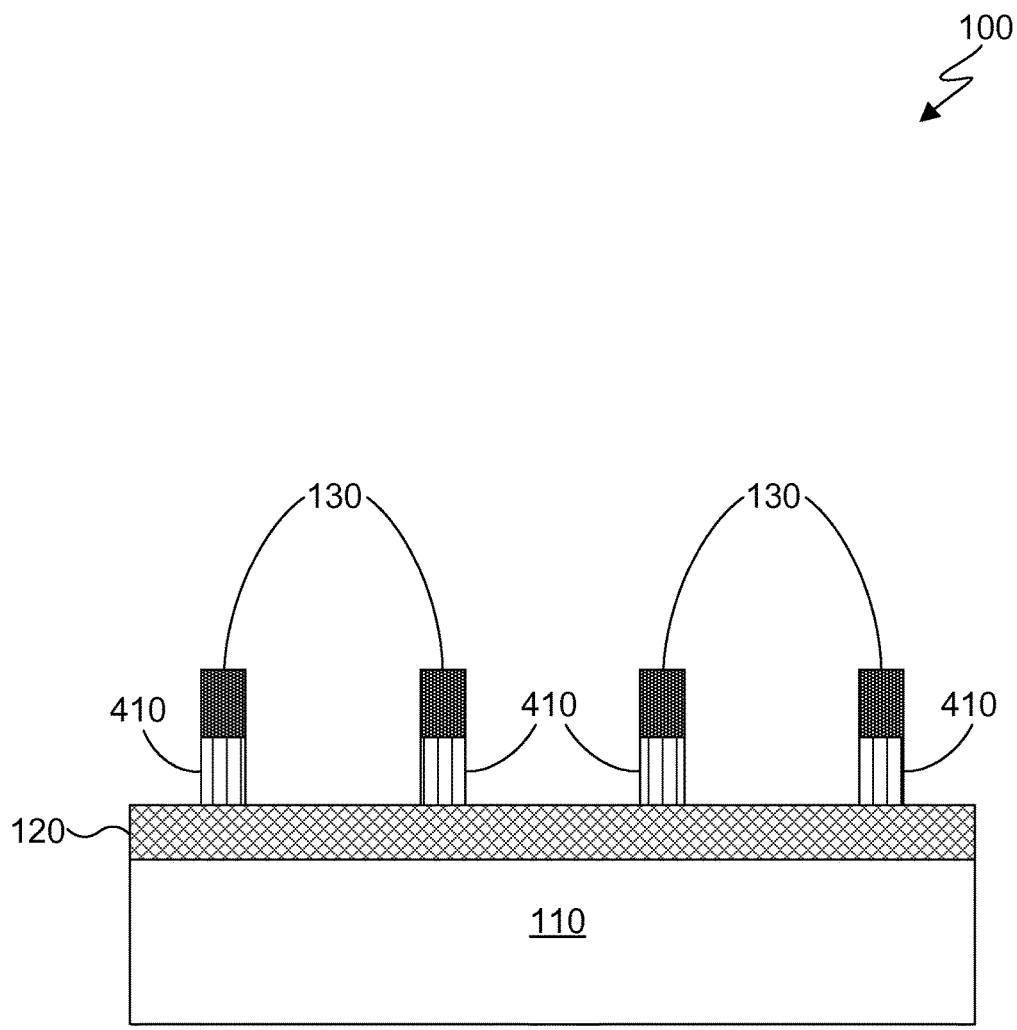
FIG. 8 illustrates a cross-sectional view of a group of fins formed within the second region of the semiconductor wafer, in accordance with an embodiment of the invention.

Examples of the result of fin patterning and formation within regions 250 and 260 are depicted and described in greater detail with respect to FIGS. 7 and 8.

FIG. 7 illustrates a cross-sectional view of a group of fins formed within region 250 of semiconductor wafer 100, in accordance with an embodiment of the invention. As depicted in FIG. 7, the fins formed within region 250 of semiconductor wafer 100 are vertical portions of semiconductor material present above buried oxide layer 120 and semiconductor substrate 110. In general, the process for releasing the suspended nanowires formed in region 260 involves the use of an etch process such as a standard clean 1 (SC-1) process utilizing ammonium hydroxide and hydrogen peroxide or a chemical vapor etch (CVE) utilizing an etchant such as hydrogen chloride (HCL) to selectively remove the portions of silicon-germanium present within the fins. Due to the fact that no silicon-germanium or germanium is present in the fins formed within region 250, the wire release process has no effect on the fins within region 250, and the fins are not released as a result of the process. In general, any etch process which can selectively remove silicon germanium (SiGe) without removing silicon can be used.

In various embodiments, any known method for making a finFET device using the fins formed and depicted in FIG. 7 can be used in various embodiments of the invention, and the invention is not limited to any particular type of finFET devices or any specific method of forming a finFET device.

FIG. 8 illustrates a cross-sectional view of a group of fins formed within region 260 of semiconductor wafer 100, in accordance with an embodiment of the invention. In the depicted embodiment, SiGe layer 410 is used as a release layer, which is removed to release semiconductor layer 130 and form a suspended nanowire. In this embodiment, SiGe layer 410 is removed using a process such as a TMAH etch in order to allow gate material to be formed all around semiconductor layer 130.

In various embodiments, either a gate-first process or a replacement gate process can be used to form a nanowire transistor device using the nanowires or fins formed using semiconductor wafer 100. In a gate-first process, the nanowires are released by selectively removing SiGe layer 410, then a metal gate structure is formed above and on the exposed sidewalls of the suspended nanowire. Once the gate structure has been formed, source and drain regions are formed in the nanowire adjacent to the gate structure.

In a replacement gate process, a dummy gate structure is formed prior to releasing the nanowire. Once the dummy gate structure is formed, source and drain regions are formed in the nanowire. After the formation of source and drain regions, the dummy gate is removed, the nanowire is released by selectively removing SiGe layer 410, and a metal gate structure is formed in the place of the dummy gate.

Additionally, it should be appreciated that after release, the nanowires formed remain rigidly attached to semiconductor wafer 100 by being attached to "pads" of semiconductor material at each of the terminal ends of each nanowire, in accordance with an embodiment of the invention. The process of anchoring a suspended nanowire to a "pad" of semiconductor material is well known in the art, and any known method for attaching a suspended nanowire to a semiconductor wafer can be used in various embodiments of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Detailed descriptions of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Having described various embodiments of implementing a hybrid finFET device and nanowire device using selective SGOI (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A silicon-on-insulator substrate having selectively formed regions, the silicon-on-insulator substrate comprising:
   a buried oxide layer present within a first region and a second region;
   the first region comprising a first plurality of fins, each fin of the first plurality of fins having an epitaxially grown silicon layer formed on a first silicon layer, wherein the first silicon layer is on the buried oxide layer;
   the second region comprising a second plurality of fins, each fin of the second plurality of fins having an epitaxially grown silicon layer formed on an annealed silicon-germanium layer; and
   wherein:
      the epitaxially grown silicon layer formed on the first silicon layer has a height equal to the epitaxially grown silicon layer formed on the annealed silicon-germanium layer;
      the epitaxially grown silicon layer formed on the first silicon layer is of the same material as the epitaxially grown silicon layer formed on the annealed silicon-germanium layer; and
      the first silicon-germanium layer has a height equal to the first silicon layer.

2. The silicon-on-insulator substrate of claim 1, wherein the annealed silicon-germanium layer is a thermally annealed silicon-germanium layer.

3. The silicon-on-insulator substrate of claim 1, wherein the buried oxide layer comprises silicon oxide.

4. The silicon-on-insulator substrate of claim 1, wherein the annealed silicon-germanium layer comprises at least 15 percent germanium.

5. The silicon-on-insulator substrate of claim 1, further comprising a semiconductor substrate present below the buried oxide layer.

* * * * *